US006397159B1

(12) United States Patent
Richardson

(10) Patent No.: US 6,397,159 B1
(45) Date of Patent: *May 28, 2002

(54) METHOD AND SYSTEM FOR CHARACTERIZING TERMINATIONS IN A LOCAL AREA NETWORK

(75) Inventor: William M. Richardson, Bolton, MA (US)

(73) Assignee: Vigilant Networks LLC, Hampton, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/426,505

(22) Filed: Oct. 26, 1999

Related U.S. Application Data

(63) Continuation of application No. 08/890,486, filed on Jul. 9, 1997, now Pat. No. 6,016,464
(60) Provisional application No. 60/021,487, filed on Jul. 10, 1996, and provisional application No. 60/029,046, filed on Oct. 29, 1996.

(51) Int. Cl.[7] .............................................. G01R 31/11
(52) U.S. Cl. ......................... 702/79; 324/533; 324/534
(58) Field of Search .............................. 702/79, 57, 58, 702/59, 158, 159; 709/224, 227, 230; 370/235, 241, 252, 466, 901, 912, 242, 245; 324/512, 527, 532, 533, 534

(56) References Cited

U.S. PATENT DOCUMENTS

| | | | |
|---|---|---|---|
| 4,580,872 A | 4/1986 | Bhatt et al. | 359/136 |
| 4,890,278 A | 12/1989 | Felker et al. | 370/252 |
| 5,062,703 A | 11/1991 | Wong et al. | 356/73.1 |
| 5,063,353 A | 11/1991 | Gubisch | 324/710 |
| 5,245,291 A | 9/1993 | Fujimura | 324/617 |

(List continued on next page.)

FOREIGN PATENT DOCUMENTS

| | | |
|---|---|---|
| DE | 3246241 A1 | 6/1984 |
| EP | 0 474 379 A1 | 3/1992 |
| EP | 0 551 695 A1 | 7/1993 |
| EP | 0 601 768 A2 | 6/1994 |
| EP | 0 675 607 A2 | 10/1995 |
| EP | 0 691 546 A2 | 1/1996 |
| EP | 0 768 537 A1 | 4/1997 |

OTHER PUBLICATIONS

Knutz, O, "Echomeβtechnik macht LAN transparent," 688 NTZ Nachrichten Technische Zeitschrift, 47(4) :242–246 (Apr. 1994).
Barrett, Robert, "Management System for Providing Quality Analysis of Ethernet Networks," Butterworth & Co (Publishers) Ltd., 12(4): 229–233 (Aug. 1989).
IBM Technical Disclosure Bulletin, *Differential Manchester Decoder Requiring Low Speed System Clock*, 31(10): 100–103 (Mar. 1989).
Jander, Mary, "Handheld LAN Testers Get a Grip on Internetworks: Net managers on the go can get some heavy help from the latest in lightweight testers," *Data Communications*; vol. 22, No. 12, , p. 95.
Tittle, Ed, "Troubleshooting Keeps LANs Up and Running," *Networking Management*, vol. 9, No. 1, p. 54(4).

*Primary Examiner*—Sam Rimell
(74) *Attorney, Agent, or Firm*—Rader, Fishman & Grauer PLLC

(57) ABSTRACT

The location of a termination in a properly terminated LAN can be remotely detected. The cable's skin effect produces a detectable signature at the sending-end when a step function, for example, reaches the termination. Accordingly, a network analysis device is connected to the network to inject the step function onto the network cabling. The voltage response of the cabling to this is first digitally sampled and then analyzed in a system controller. The system controller reviews the sampled data for an inflection point and then locates the termination by reference to the delay between when the signal was placed on the cable and the detection of the inflection point.

15 Claims, 11 Drawing Sheets

U.S. PATENT DOCUMENTS

| | | | |
|---|---|---|---|
| 5,289,390 A | 2/1994 | Unverrich | 345/150 |
| 5,381,348 A | 1/1995 | Ernst et al. | 324/534 |
| 5,402,424 A | 3/1995 | Kou | 370/324 |
| 5,430,665 A | 7/1995 | Jin et al. | 702/163 |
| 5,461,318 A | 10/1995 | Borchert et al. | 324/533 |
| 5,498,965 A | 3/1996 | Mellitz | 324/532 |
| 5,586,054 A | 12/1996 | Jensen et al. | 324/533 |
| 5,677,633 A | 10/1997 | Moser et al. | 324/539 |

METHOD AND SYSTEM FOR CHARACTERIZING TERMINATIONS IN A LOCAL AREA NETWORK

RELATED APPLICATIONS

This application is a continuation of U.S. application Ser. No. 08/890,486, filed Jul. 9, 1997, now U.S. Pat. No. 6,016,464, which claims priority to U.S. Provisional Application No. 60/021,487, filed Jul. 10, 1996, and also claims priority to U.S. Provisional Application No. 60/029,046, filed Oct. 29, 1996, the contents of which are incorporated herein by this reference in their entirety.

BACKGROUND OF THE INVENTION

Physically, local area networks (LAN) comprise a transmission medium and network devices that transmit through it. The transmission medium is typically coaxial or twisted-pair wiring. The network devices or nodes are the network cards of computer workstations that utilize the network cabling to communicate with each other. Dedicated network devices such as hubs, repeaters, bridges, switches, and routers are also used to manage or extend a given LAN or act as inter-networking devices.

One of the most common protocols for a LAN is termed carrier sense multiple access with collision detection (CSMA/CD). This protocol is sometimes generically, but incorrectly, referred to as Ethernet, which is a product of the XEROX Corporation. I.E.E.E. has promulgated standards for this protocol; IEEE 802.3 covers 1-persistent CSMA/CD access method and physical layer specification. The protocol comes in various implementations, 10Base(2) and (5) are 10 megabit per second (MBPS) networks using different gauges of coaxial cable (2 and 5) in a bus topology. 10Base(T) also operates at 10 MBPS but uses twisted-pair cabling in a star topology in which each node connects to a hub. Newer 100 MBPS implementations such as 100Base(T) are becoming more common with 1 GigaBPS devices in planning and testing.

A number of problems can arise at a LAN's physical layer. In the case of twisted-pair or coaxial wiring, the electrical conductors may become frayed or broken. The shielding may be damaged, failing to protect the conductors from surrounding electromagnetic interference and changing the cable's characteristic impedance. Moreover, the terminators at the end of the network cables in bus topologies or the terminators in the nodes at the ends of the links in star topologies may be poorly matched to the characteristic impedance of the network's cables or non-existent. This produces signal reflections that can impair the operation of the network.

Another potential problem with a network is the fact that cabling may be too long. The IEEE 802.3 10Base(T) protocol, for example, limits the cable length to 200 meters with repeaters. This restriction is placed on networks because signals require a non-trivial time to propagate through the entire length of a CSMA/CD network relative to the data rate of the network. Network devices, however, must have some assurance that after they have been transmitting for some minimum time that a collision will not thereafter occur. Additionally, the end of each packet transmission must be allowed to propagate across the entire network before the next transmission may take place. If the cabling is long, the time allocated to this may begin to consume too much of the network's potential bandwidth.

A number of techniques exist for validating a network at the physical layer. The most common approach is called time domain reflectometry (TDR). According to this technique, a predetermined signal, typically a step-function, is injected onto the network cabling. The TDR system will then listen for any returning echoes. Echoes arise from the signal passing through regions of the cable where the characteristic impedance changes. Based upon the amplitude of these reflections and the delays between the transmission of the signal onto the cable at the sending-end and the receipt of the reflection back at the sending-end, the location of the impedance change, a frayed portion of cable for example, may be located.

TDR has been used to determine the length of the network cable and thus whether it conforms to the relevant protocol. Prior to testing, the network's terminators are removed and the conductors are shorted together or open circuited. The length of the cable may then be determined based on the time delay between when the TDR signal is placed on the network and when the open- or short-circuit reflection is detected at the sending-end.

SUMMARY OF THE INVENTION

The problem with known cable length detection methods is that they rely on the removal of the terminators or on a reflection producing device. The terminators, however, are necessary to the proper operation of the network. Thus, the cable length can only be determined on a non-operational network. This requirement is not unduly restrictive in the case of validating a newly installed network since the TDR analysis may be performed prior to the installation of the terminators or attachment of the nodes. This requirement, however, negates the periodic monitoring of an operational network and the diagnosis of a previously installed network that is exhibiting problems.

In the invention, the location of a properly configured terminator i.e., a terminator that has been configured to closely match the characteristic impedance of the network cabling, can be remotely detected by analyzing the network's response to a predetermined signal for skin effects. In more detail, the terminator produces a signature that is detectable at the sending-end when predetermined signal, such as a current step function, is injected onto the network cabling. The magnitude of the voltage at the sending-end will slowly increase. This results from the skin effects and accumulated d.c. resistance across the length of the cable as the step function propagates down its length. After a time corresponding to twice the propagation time between the sending-end and the terminator, the voltage will undergo an inflection. After this inflection, the voltage asymptotically returns to the voltage level initially produced when the step function was generated.

According to the invention, a network analysis device is connected to the network to inject a predetermined signal, such as the step function, onto the network cabling. The voltage response of the cabling to this excitation is first digitally sampled and then analyzed in a system controller. The system controller reviews the sampled data for the signature of the terminator and then locates it by reference to the delay between when the signal was placed on the cable and the detection of the signature.

In specific embodiments, the terminator is detected by determining a change in the influence of skin effects on the response resulting from the step function, which is preferably encased in a packet-like transmission, for example, reaching the terminator. The change in skin effects is evidenced by an inflection point in the induced voltage on the network cabling.

In other aspects of the embodiments, the signature of the terminator is detected by calculating a first-order differential of the response as a function of delay from the generation of the predetermined signal and located where the first order differential indicates an inflection at a highest time delay from the predetermined signal According to another aspect, the invention features a computer network analysis method. The signal responses of communications links of a computer network are detected and terminators identified on the communications links based on the signal responses. The acquired information is then displayed, including measures of lengths of the communications links of the computer network.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1A:
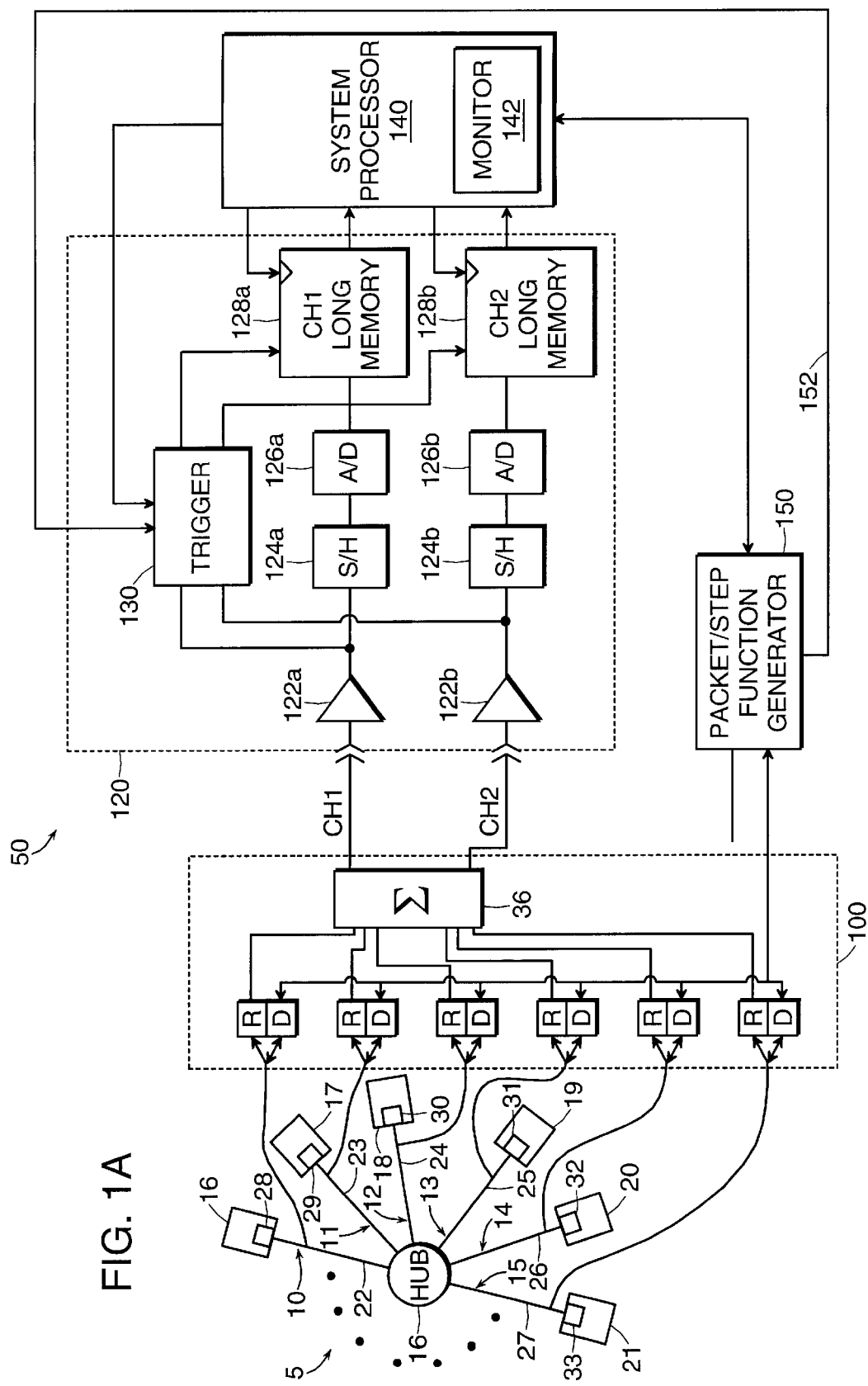
FIG. 1A is a block diagram showing a network diagnostic device of the present invention.

FIG. 1A illustrates a network diagnostic device 50 implementing the present invention. Other aspects of the device are described in U.S. pat. appl. Ser. No. 08/619,934, filed on Mar. 18, 1996, entitled Packet Network Monitoring Device, the teachings of which are incorporated herein in their entirety by this reference.

The illustrated network 5 is configured in a star topology, such as in 10Base(T). It incorporates multiple links 10–15, which operate in a common collision domain, although separate collision domains could exist between the links in other implementations. The nodes or computers 16–21 are located at the ends of network cables 22–27 for each of the links. Each of the nodes includes a terminator 28–33 that is matched to the characteristic impedance of the corresponding cables. In the case were each of the links 10–15 is a bus-style network connecting several computers, separate terminator devices are connected at the ends of the network cables 22–27. A hub 16, or alternatively switch or other network communications device, enables communications between the nodes by retransmitting packets between the links.

A media interface unit (MIU) 100, or attachment unit, connects a digitizer 120 and signal generation circuits 150 to the physical layer of the network's links 10–15. The MIU includes the receiver units R that collectively provide a two-channel input to the digitizer 120 through a summing network 36. The summing network 36 enables individual links to be monitored, or combines the signals of multiple links, on a channel of the digitizer 120. For adequate analog resolution, the digitizer should have at least a 500 MHz sampling frequency with eight bits of resolution per sample and a long memory capacity of at least one megabyte of eight bit samples, or preferably 2 to 4 megabytes for 10 MBPS networks. Analysis of 100 MBPS to 1 GBPS networks is facilitated with correspondingly faster sampling frequencies and longer memory capacities.

Figure 1B:
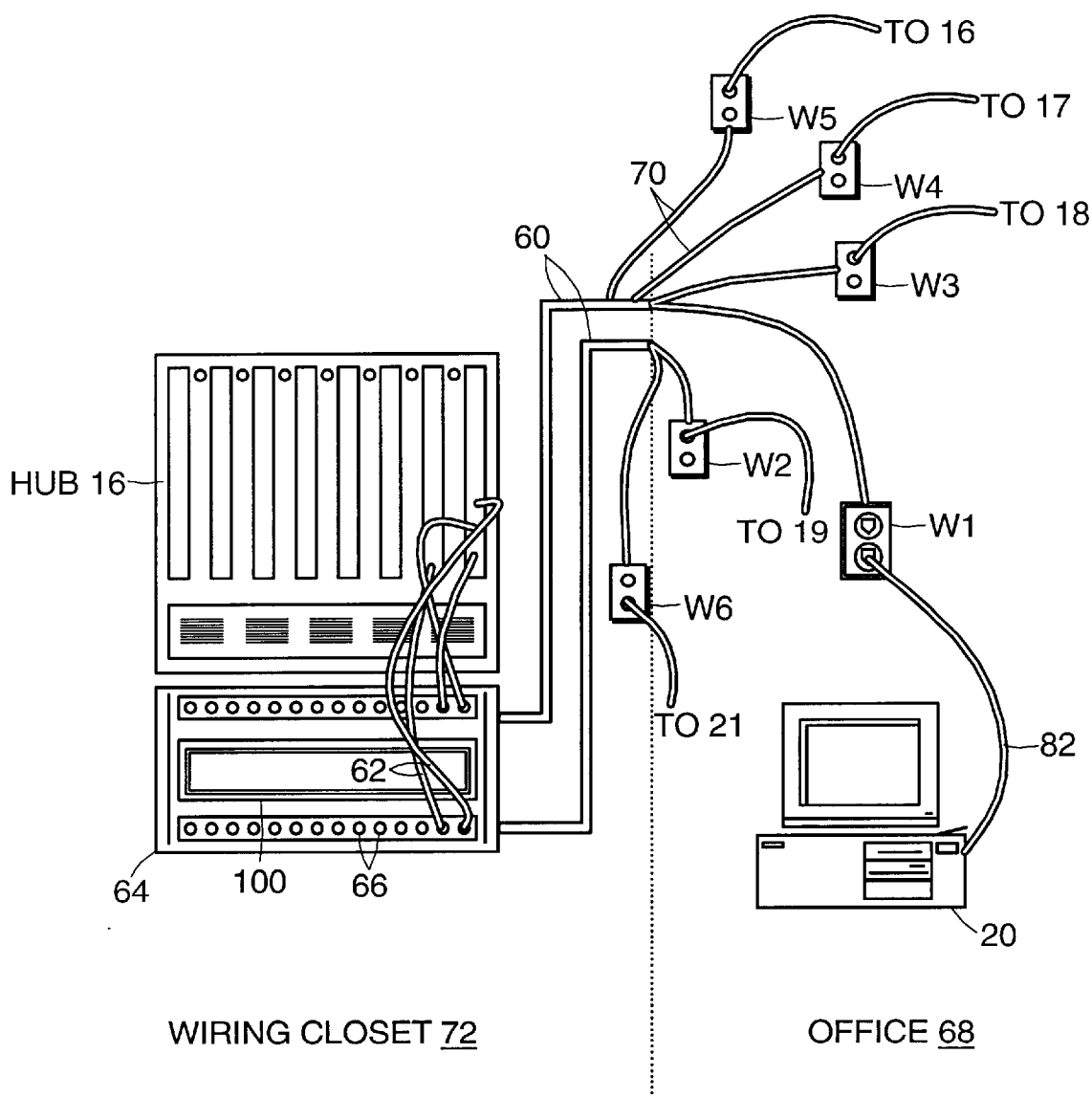
FIG. 1B is a schematic diagram showing the cross-connect panel supporting physical layer access for the MIU according to the present invention.

FIG. 1B shows one implementation of the MIU 100 integrated into a cross connect panel of the invention. Each remote network node 16–21 is connected to a wall panel W1–W6, commonly located in the office 68 in which the computer 20 is located. These wall panels receive, in one implementation, four twisted pair wires supporting a communications link in a common jack or connector scheme. The wires 70 from the wall panels W1–W6 are bundled into larger horizontal cables 60 of 24 to 48 separate groups of four twisted-pair wires from other nodes in other offices.

Each of the horizontal cables 14 terminates usually in a wiring closet 72 housing the cross-connect panel 64 and the network communications device 16. Each group of wires of a communications link is associated with and electrically connected to a separate panel-device connector 66 on the front of the cross-connect panel 10. Short jumper cables or patch cords 62 are used between each panel-device connector 66 of the cross-connect panel 64 and the network device 16.

Generally, cross-connect panels provide a convenient way to terminate the horizontal cables 60 while allowing computers to be connected to different ports of the network communication device 16. Moreover, the network communications device may be replaced simply by switching the patch cords 24.

The panel 64 includes a monitoring port to which the media interface unit (MIU) 100 is connectable. The port provides physical layer access to the communications links by supporting direct signal taps to the communications media of the links.

Returning to FIG. 1A, the digitizer 120 comprises a buffering amplifier 122a, 122b on each of the two channels Ch1, Ch2. Two sample-and-hold circuits 124a, 124b downstream of each amplifier freeze the detected voltage in each channel for digitization by two analog-to-digital converters 126a, 126b. The digital outputs of the converters are written into two long memories 128a, 128b, one assigned to each channel Ch1, Ch2. The memories 128a, 128b function as first-in, first-out (FIFO) buffers that continuously receive and store the output from converters 126a, 126b until a trigger signal is received.

A system processor 140 is connected to read the arrays of data from the long memories 128a, 128b of the digitizer 120. In one implementation, it is a personal computer/workstation, which is also connected to the network 5 via a conventional network card. The system processor 140 performs signal processing on the data arrays. The system processor 140 also provides the overall control of the device 50.

A packet/step function signal generator 150, also under the control of the system processor 140, is connected to the network 5 via drive circuits D. The signal generator 150 has much of the control logic that would be contained in a network card for the relevant network. It can determine when other nodes are transmitting, determine incidences of collisions, and assess when a packet transmission can be made in accordance with the network's protocol.

The signal generator 150 produces a hybrid step/packet transmission in order to allow the device 50 to perform terminator and physical layer analysis while the network 5 is operational. Nodes 16–21 can behave unpredictably if a lone step function is transmitted over an idle network. The nodes, however, will generally ignore a packet transmission as long as it is not addressed to the nodes. To utilize this behavior, the signal generator 150 is configured to generate a broadcast diagnostic packet. Packets with this source and destination address will be universally ignored by the network's nodes. The step function is inserted where a data payload would typically be found. This renders step function transparent to the nodes.

Figure 2:
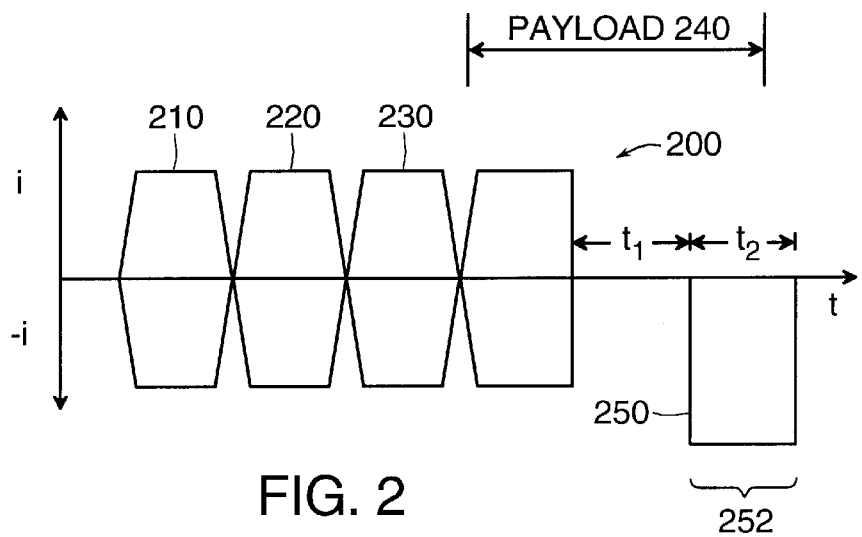
FIG. 2 is a timing diagram showing a hybrid packet/step function for detecting terminations on an active network.

FIG. 2 schematically shows the hybrid step/packet transmission 200 for a 10Base(T) CSMA/CD network. In compliance with the network's protocol, the packet 200 has a standard length preamble 210. The source and destination addresses 220, 230 conform to a diagnostic broadcast packet. A data payload 240 is started, but then after a predetermined time, the voltage on the cabling is held at a quiescent level, i.e. 0 Volts in most networks, for time $t_1$. This period corresponds to the time that is required for a signal to traverse the entire network, usually between 1 and 6 microseconds. This delay allows any echoes to die out. Then, the edge 250 of the current step function 252 is generated by producing a predetermined amount of current on the network cabling. This raises the magnitude of the voltage on the cabling to a selected level, e.g. 0.5–5 Volts. As shown, this voltage is preferably close to the normal voltage swings experienced during data transmission, but a stronger signal-to-noise ratio can be obtained by using higher voltages. In either case, the voltage swing should not be so large as to create the risk of damage to any of the node's network cards.

The step function 252 is maintained for a time that is long enough to allow the edge to propagate throughout the network and the response received back by the digitizer at the sending-end at time $t_2$. At the expiration of this time, the voltage on the network is brought back to a quiescent state allowing the other nodes on the network to recognize the end of the transmission.

The digitizer 120 is used to detect the response of the network 10 to the step function. A trigger device 130 of the digitizer is armed by the system processor 140 and triggered by the packet/step generator 150 in response to the transmission of the hybrid packet on the network. The system processor then extracts any detectable echo from the sampled event. By analyzing the echo, the location of network termination is determined.

Figure 3:
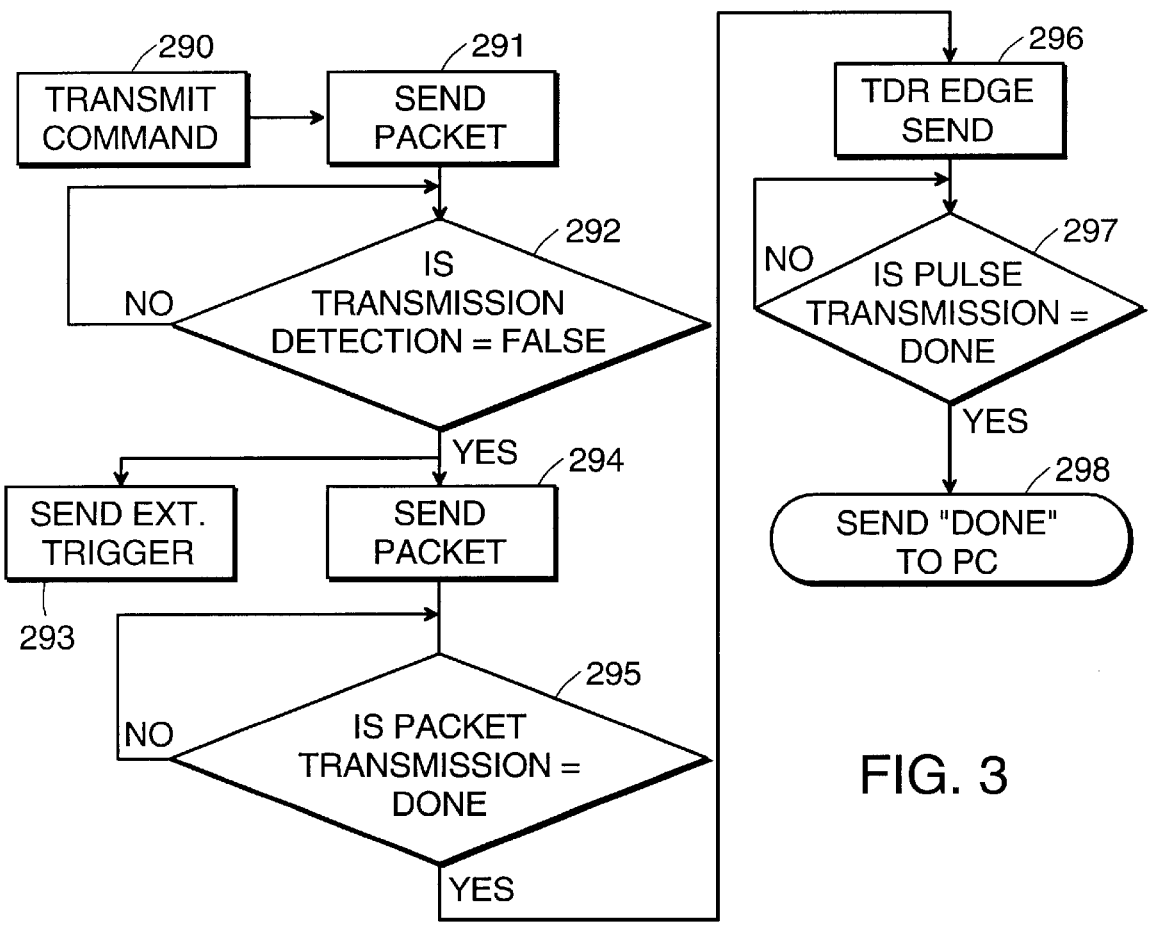
FIG. 3 is a state diagram illustrating the operation of the packet/step function generator.

FIG. 3 is a state diagram for the packet/step function generator 150. The generator is activated by a transmit command that is received from the system controller 140 in step 290. It then prepares to send the packet in step 291. First, it waits until the network is idle in step 292. When there are no transmissions on the network cabling, an external trigger is sent to the trigger device 130 of the digitizer 120 in step 293 and the packet 200 is transmitted on the network in step 294. The generator then waits until the packet transmission is finished in step 295. This transmission includes the broadcast source and destination address 230,220, the start of the payload 240, and the "silent" time $t_1$ to allow echoes to die out. The edge 250 is then sent in step 296. It again waits for the conclusion after time $t_2$ and then signals the system controller 140 in steps 297 and 298.

Figure 4:
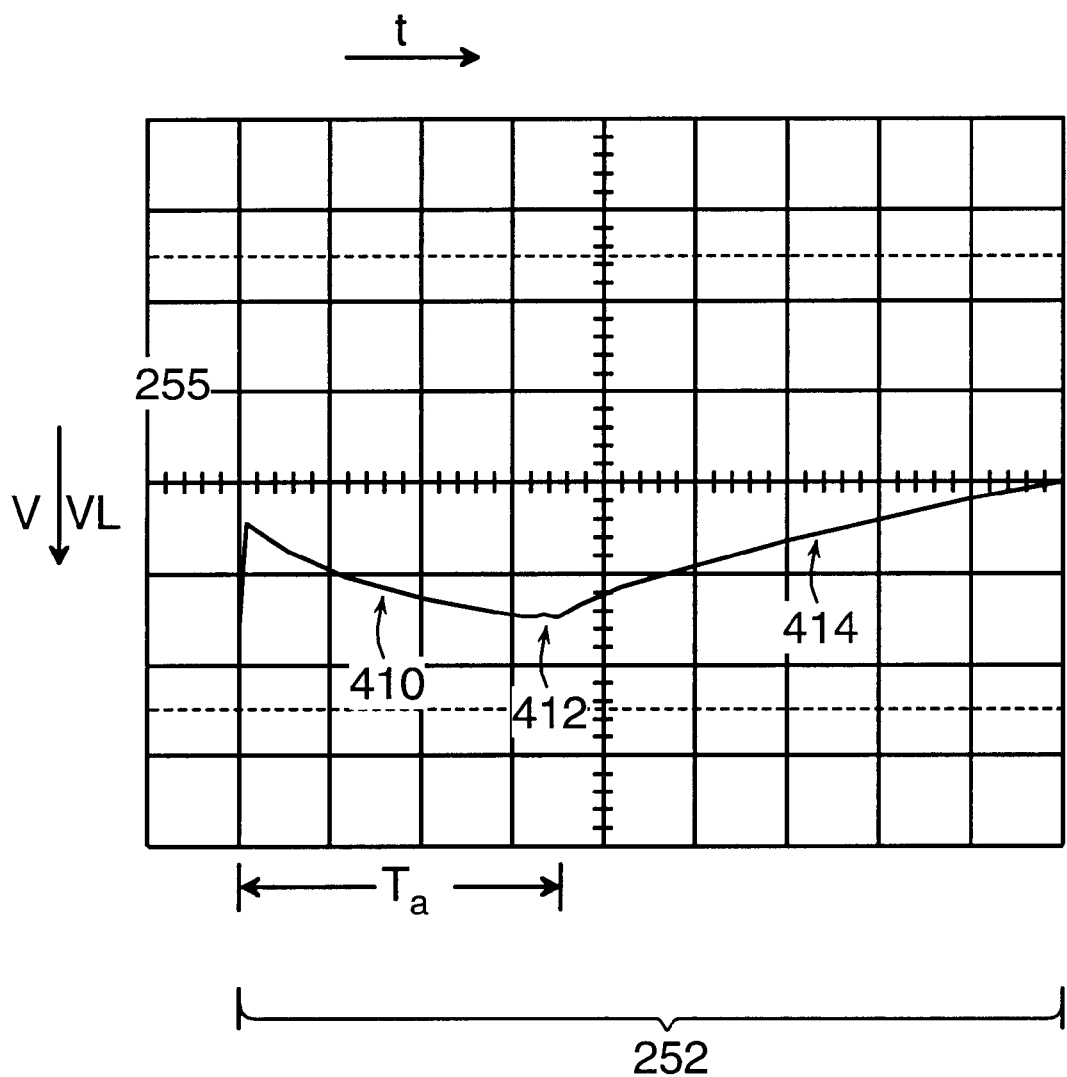
FIG. 4 is a graph of the voltage as function of time when a step function is placed on the network cabling of a LAN.

FIG. 4 shows an exemplary network response to the current step function 252 at the sending-end. For clarity, only the portion of sampled signal that resulted from to the step function is shown. In the properly terminated network, the response of the network to the step function 252 exhibits two slopes. The first slope 410 is indicative of the accumulated DC resistance and skin effects of the cable as the edge 250 propagates towards the terminations 28–33. The magnitude of the voltage slowly increases from its initial level v1 just after the edge 250. At a time that corresponds to twice the propagation time $T_a$ between the insertion point for the edge 250 and the termination, the network response exhibits an inflection point 412 where the voltage begins to drift back to its initial level v1 with a new slope 414.

The system processor 140 processes this data from the digitizer 120 and locates the inflection point 412 and determines time $T_a$. Then, by reference to the signal propagation speeds across the network cabling 22–27 the processor 140 calculates the distance to the terminators 28–33.

Figure 5:
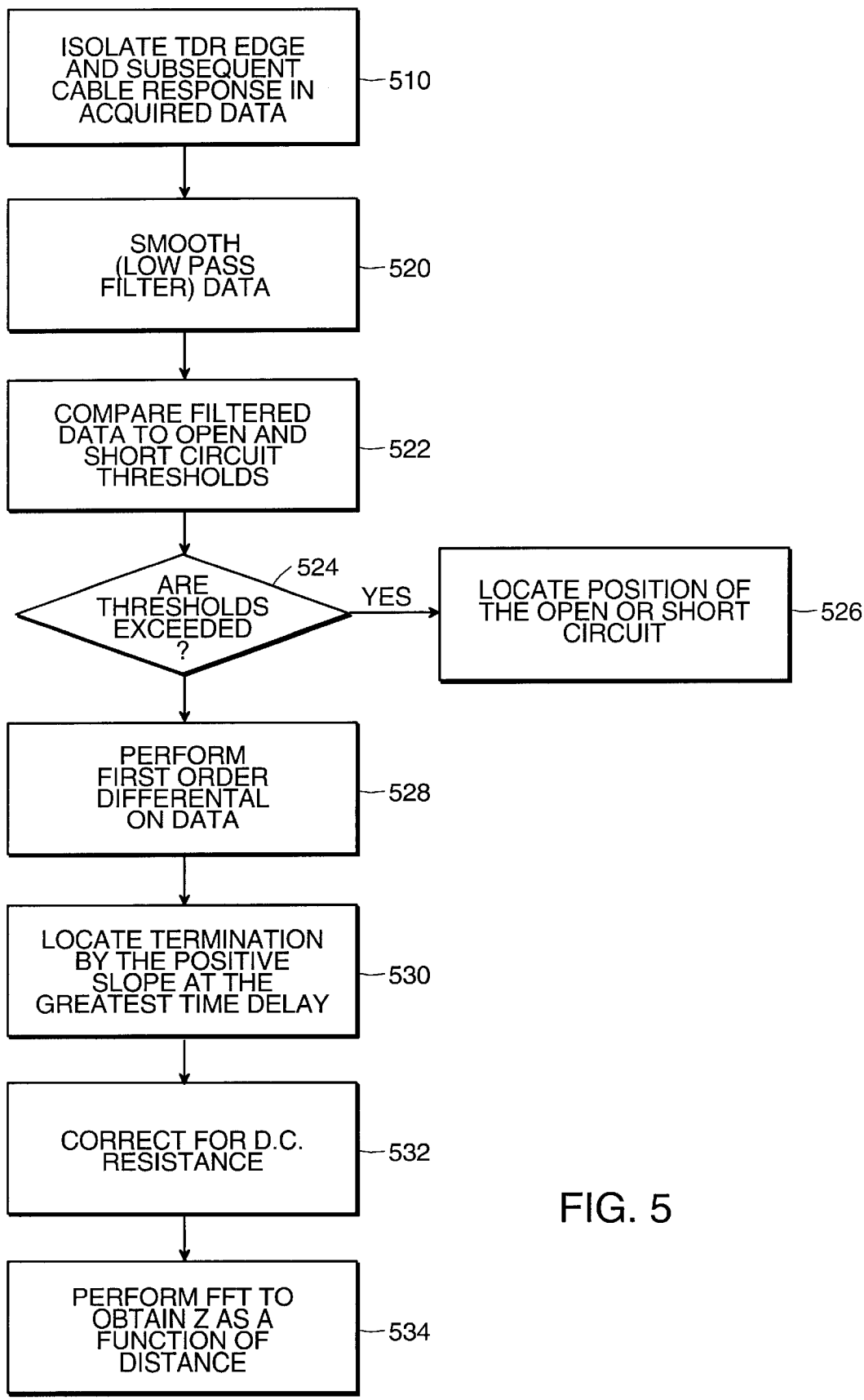
FIG. 5 is a process diagram illustrating the data processing performed on the cable's response to the TDR edge to find the terminator.

FIG. 5 illustrates the signal processing performed by the system processor 140. The first step in the signal processing is to isolate the cable's response to the TDR edge in step 510. As described in connection with FIG. 3, the data acquisition is triggered in response to the beginning of the hybrid/TDR packet shown in FIG. 2. For the analysis, however, the only relevant portion of the sampled signal event is the cable's response to the TDR edge 250. FIG. 4 shows an isolated cable response. This response is exceptionally clean, without distortion, example where the terminator inflection point 412 is very evident.

Figure 6:
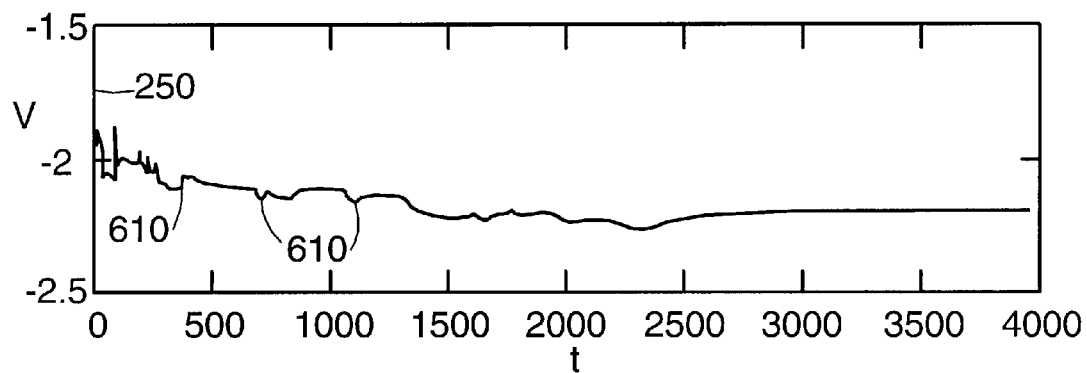
FIG. 6 is a voltage vs. time plot of an exemplary cable response.

Possibly a more common cable response, or worse case situation, is shown in FIG. 6. This cable response shows a number of changes in the cable's characteristic impedance 610 at various time delays from the TDR edge 250. These could be caused by cable splices, different types of cable, or damage to the cable shielding, for example.

Figure 7:
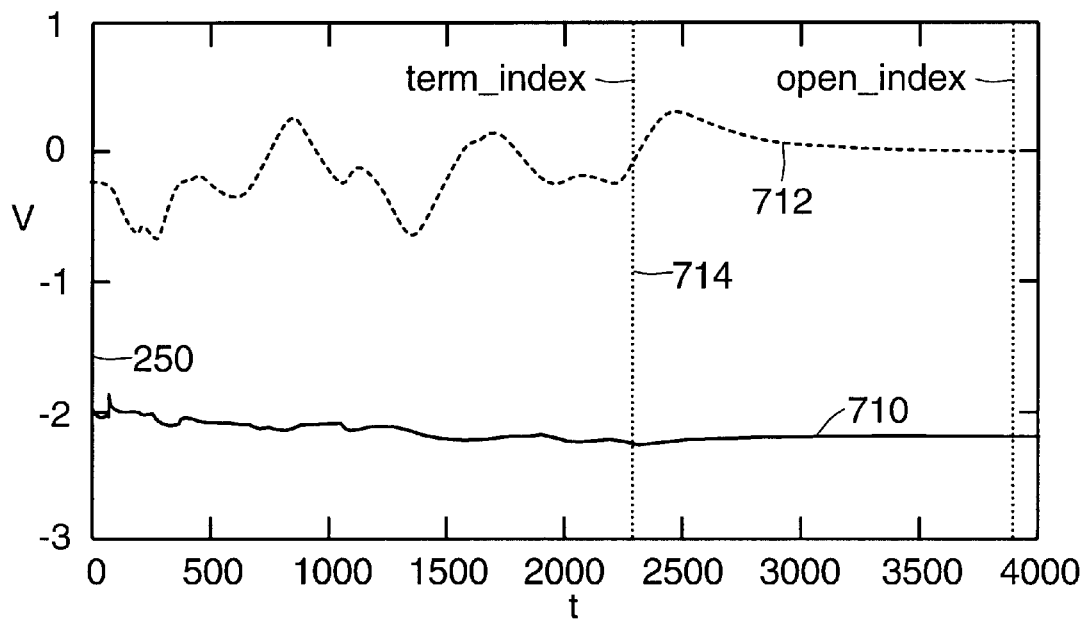
FIG. 7 shows a low pass filtered and first order differential of the exemplary cable's response.

The data that corresponds to the cable's response is then low pass filtered in step 520. This filtering smooths any high frequency spikes in the cable's response to facilitate the analysis of the trends in the data. The response labelled 710 in FIG. 7 shows the low pass filtered response of the cable response shown in FIG. 6. Many of the spikes 610 are removed in the low pass filtered response 710 of FIG. 7.

The filtered data is then compared to short and open circuit thresholds in step 522 of FIG. 5. If the end of the circuit is not properly terminated in the characteristic impedance, but is an open circuit, the cable's response will be characterized by an increase in the voltage at a delay that corresponds to the distance to the open circuit. The inductance associated with the cable length causes the detected response to increase to twice the voltage of the initial TDR edge 250 in the case of a complete open circuit. An appropriate open-circuit threshold is 190% of the voltage of the TDR edge. This threshold is applied to the cable's response to determine whether an open circuit exists and the distance to the open circuit represented by the time delay at which the threshold is exceeded.

Contrastingly, a short circuit at the end of the cable will be characterized by drop in the magnitude of the voltage on the cable. This corresponds to the dissipation of the energy of the TDR edge 250 to ground as the step function reaches the short-circuit. An appropriate short-circuit threshold is 10% of the voltage of the step function's magnitude. This threshold is similarly applied to the cable's response in step 522.

If either of the open or short circuit thresholds are exceeded as determined in step 524, the distance to the short or open circuit corresponds to one-half the delay until either of thresholds are exceeded in the cable's response in step 526.

On the assumption that a short or open-circuit is not detected, i.e., the cable is probably properly terminated with a termination that closely matches the cable's characteristic impedance, a first-order differential is performed on the cable's response to the TDR edge 250 in step 528. The result of this processing is a plot showing how the cable's response is changing as a function of the delay from the TDR edge. The first order differential of the low-pass filtered response 710 is identified as 712 also in FIG. 7.

The terminator is then located by finding the highest time delay at which the first order differential becomes positive and remains positive in step 530. This analysis is conceptionalized by beginning at the right side of the first-order differential plot 712 in FIG. 7, and then scanning leftward until the zero-crossing is found (see reference 714). This corresponds to the inflection point 412 described in connection with FIG. 4, and the time delay between the zero-crossing 714 and the TDR edge 250 corresponds to twice the distance to the terminator or node at the end of the cable. The physical distance is calculated by multiplying the time delay by the propagation speed of the signals over the cable and dividing by two.

As shown in steps 532 and 534, further processing is optionally performed to identify impedance problems with the network cabling. First, a resistance correction must be performed in factor out the contribution of the real portion of the cable's resistance to the response in step 532. Since the real resistance has no frequency dependence, by definition, it will not distort any signals transmitted on the line other than causing attenuation.

Figure 8:
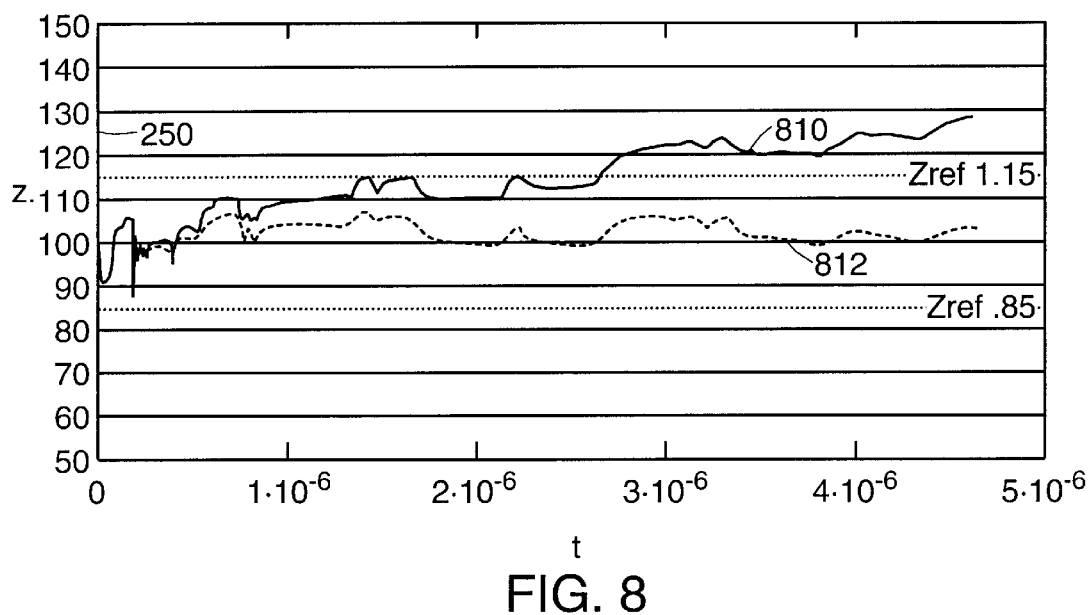
FIG. 8 shows another exemplary cable response illustrating a correction for the real resistance of the cable.
Figure 9:
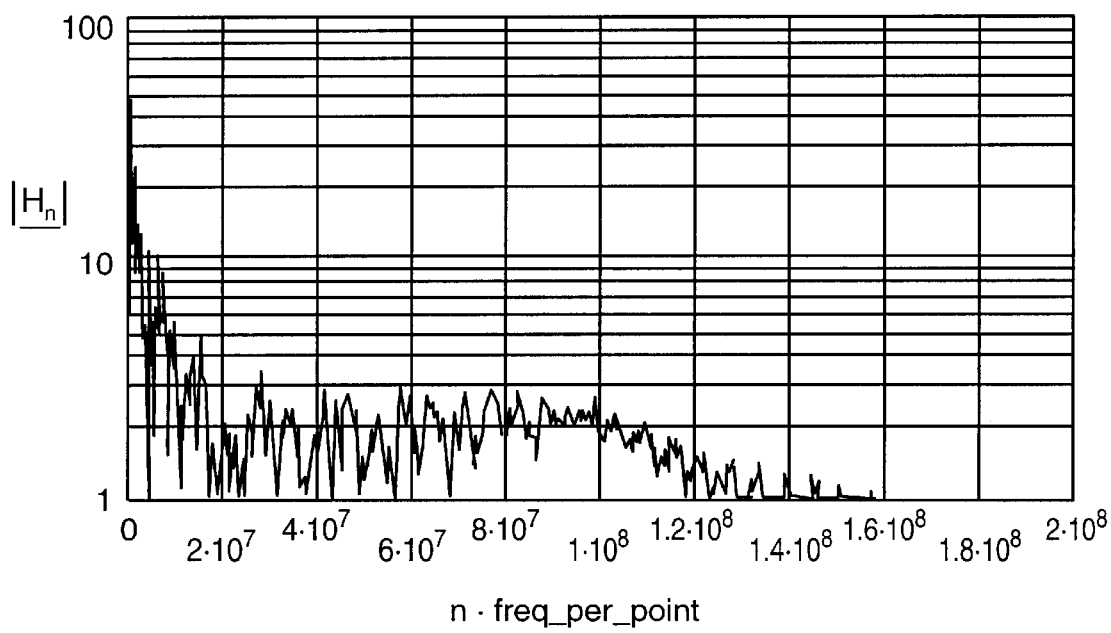
FIG. 9 is an impedance spectrum for the cable response shown in FIG. 8.

FIG. 8 shows an exemplary cable impedance as a function of time delay. Plot 810 is the total, real and imaginary, impedance as a function of time delay. Plot 812 represents the response that is dictated by only the imaginary portion, i.e., reactance, of the cable's impedance. An impedance frequency spectrum shown in FIG. 9 is then generated by normalization and by performing a fast Fourier transform (FFT) on the impedance response 812. This analysis exposes problems with the cable that may cause improper operation in certain networks by showing the frequencies that are subject to distortion.

Figure 10:
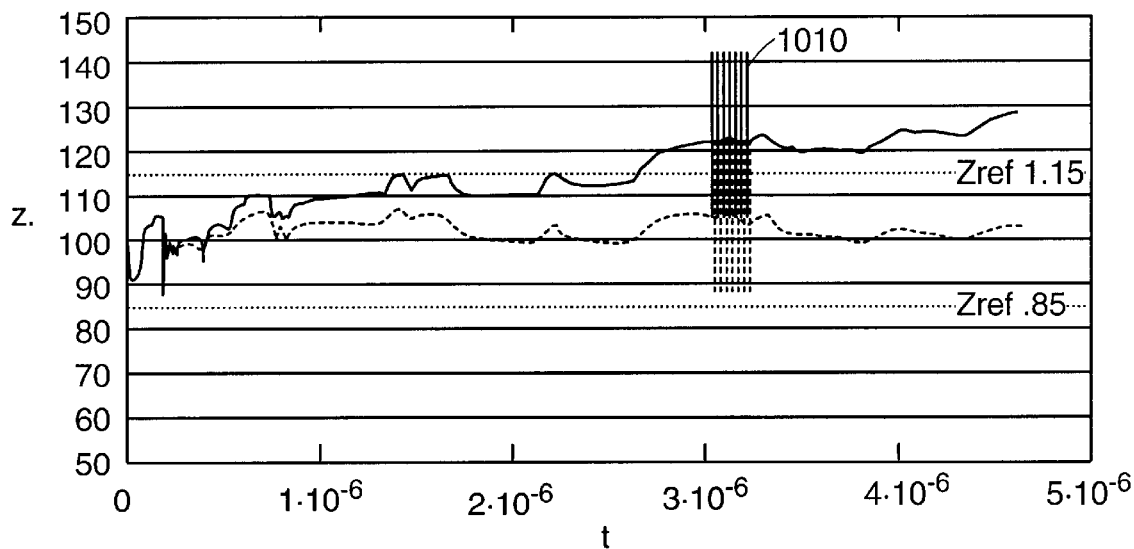
FIG. 10 is another exemplary cable response showing the effect of an LC circuit.
Figure 11:
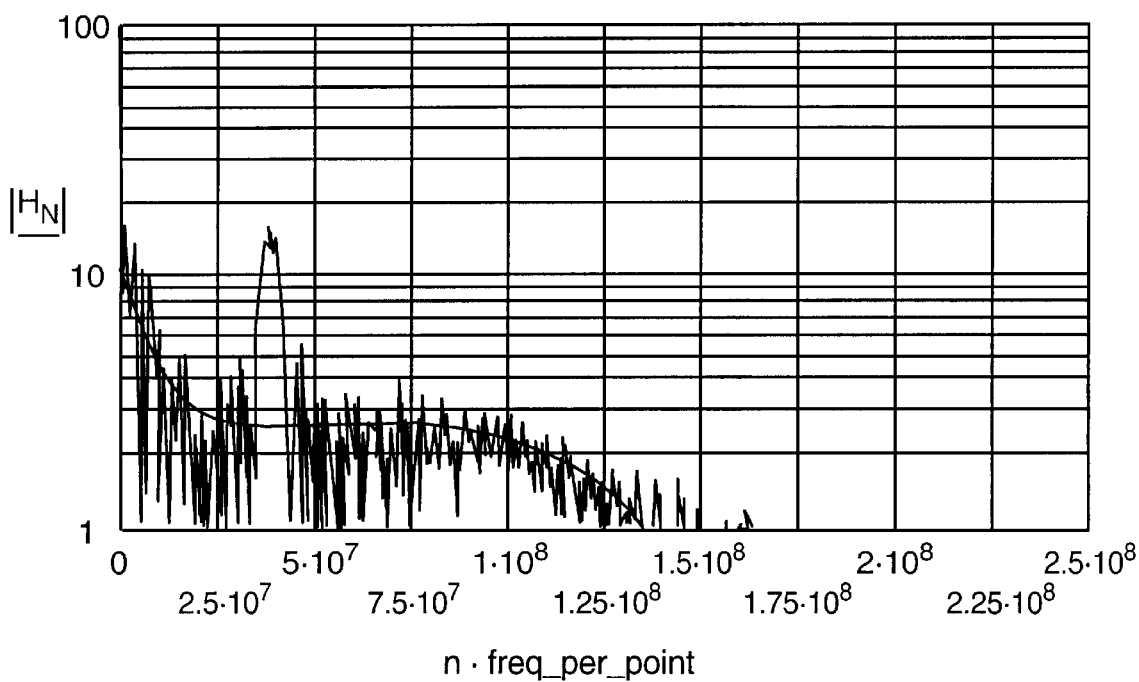
FIG. 11 is an impedance spectrum for the cable response of FIG. 10.

For example, the cable response shown in FIG. 10 could occur in the case of a LC circuit that creates the ringing effect shown by the brief sinusoidal pulse 1010. The frequency analysis of this response is shown in FIG. 11. The spike at 35 MHz is characteristic of the LC circuit ring shown in FIG. 10. By this analysis, the distortion used by the LC circuit would not be a problem in a 10Base(T) network, for example, that network is band limited under 35 MHz. This spike, however, could present substantial problems to a 100Base(T) network whose operation frequency range includes 35 MHz.

Figure 12:
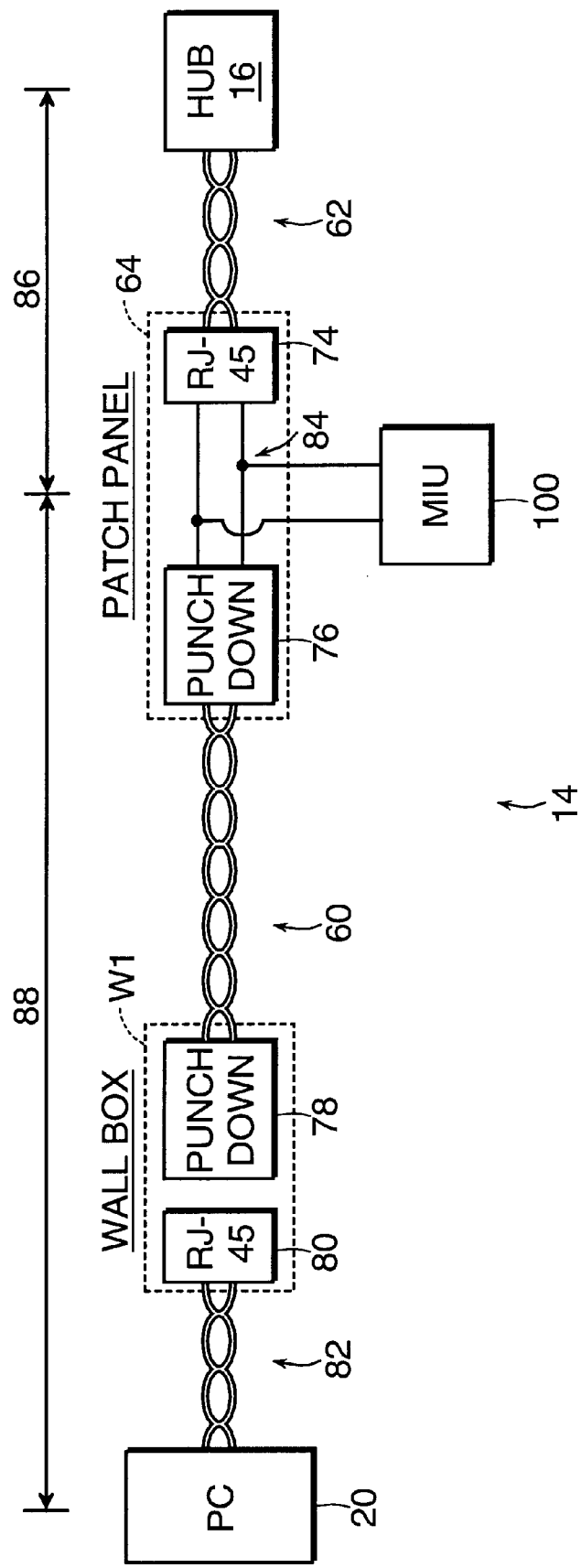
FIG. 12 is a schematic diagram showing the elements of a network link and the point of attachment of the MIU.

In some instances, added processing or compensation is necessary where the injection point of the TDR step function signal is not at or near an end of the network link. FIG. 12 is a block diagram showing the components forming a monitored link 20 when the cross-connect or patch panel 64 of FIG. 1B is used to connect the network diagnostic device 50 to the network 5. The patch panel 64 supporting the connection to the network link's physical layer is located at a non-end point on the link. A patch cable 62 connects the panel 64 to the hub or other network device 16 usually via a standardized connector 74, an RJ-45-type connector, in the illustrated implementation. The other end of the link 14 extends from a punch-down channel 76 in the panel 64 through the horizontal cable 60 to a wall box W1 at an office, which has a second punch-down channel 78 and connector 80. A second patch cable 82 typically connects the computer or network device 20 to the wall box W1.

The TDR signal injected at the patch panel propagates both ways along the link 14 from the point of injection 84. It travels to the hub 16 and to the node 20. Thus the response detected at the panel 64 is a composite response of the connection to the hub-side 86 and node-side 88 of the link 14. This effect undermines the previously described analysis.

Figure 13:
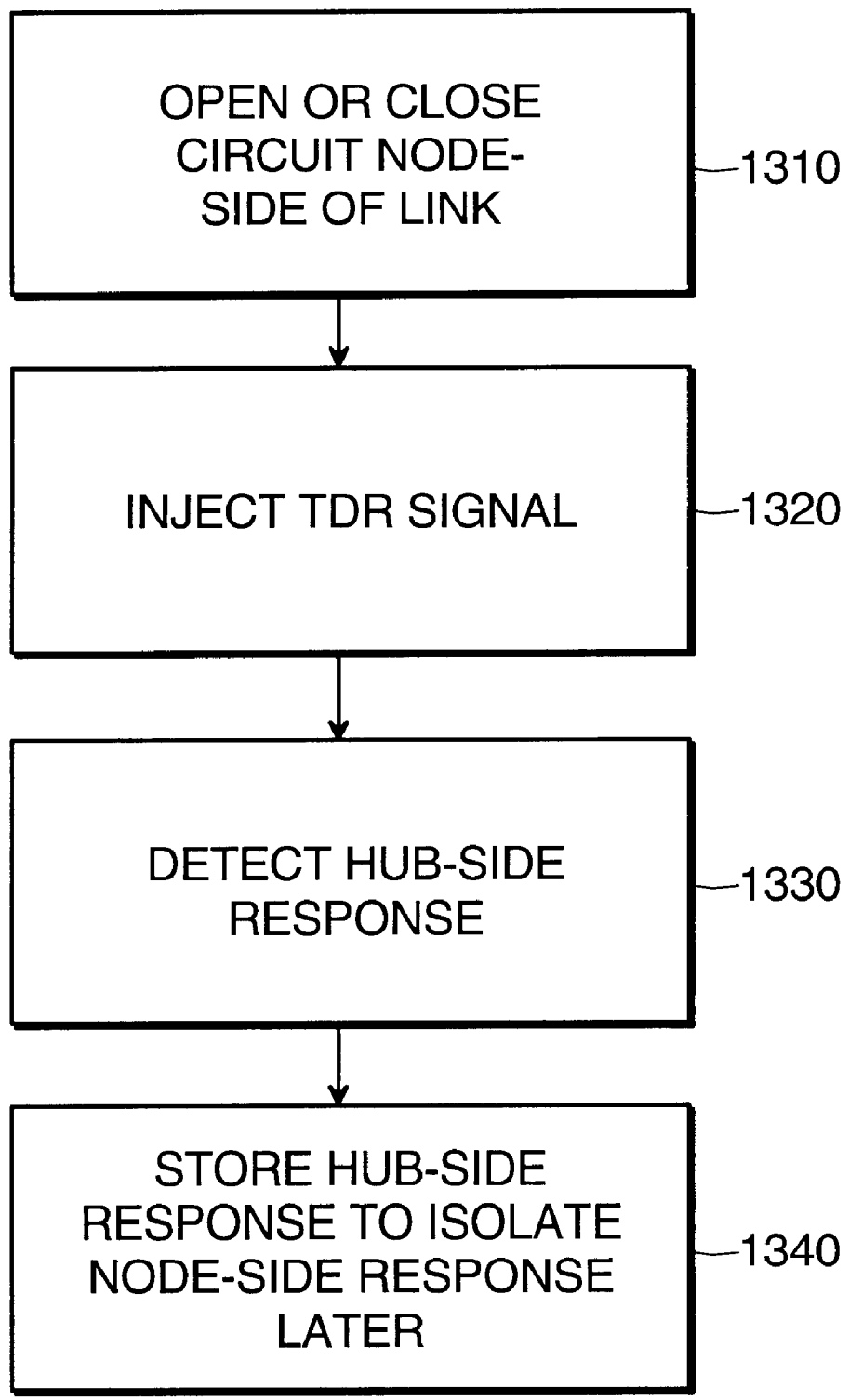
FIG. 13 is a process diagram showing the isolation of the node-side response of the link.

FIG. 13 is a process diagram showing calibration processing typically performed when the network is first installed to isolate the node-side response. The node-side 88 of the patch panel 64 is opened or closed circuited at the punch down channel 76 in step 1310. The TDR signal is then injected onto the cabling in step 1320. The detected response is only that of hub-side 86 of the link 14. This response is stored in connection with the link 14 in step 1340.

The stored hub-side response is later used to analyze the node-side 88 of the link 14. The response of the link to the TDR signal is detected in the fully connected and functioning network. This response is a composite of the node-side and the hub-side responses. The hub-side response determined during calibrating, however, is subtracted from the composite response to isolate the node-side response. This node-side portion of the link is typically the most important for monitoring purposes since it is more susceptible to acquired damage and unauthorized changes.

Figure 14:
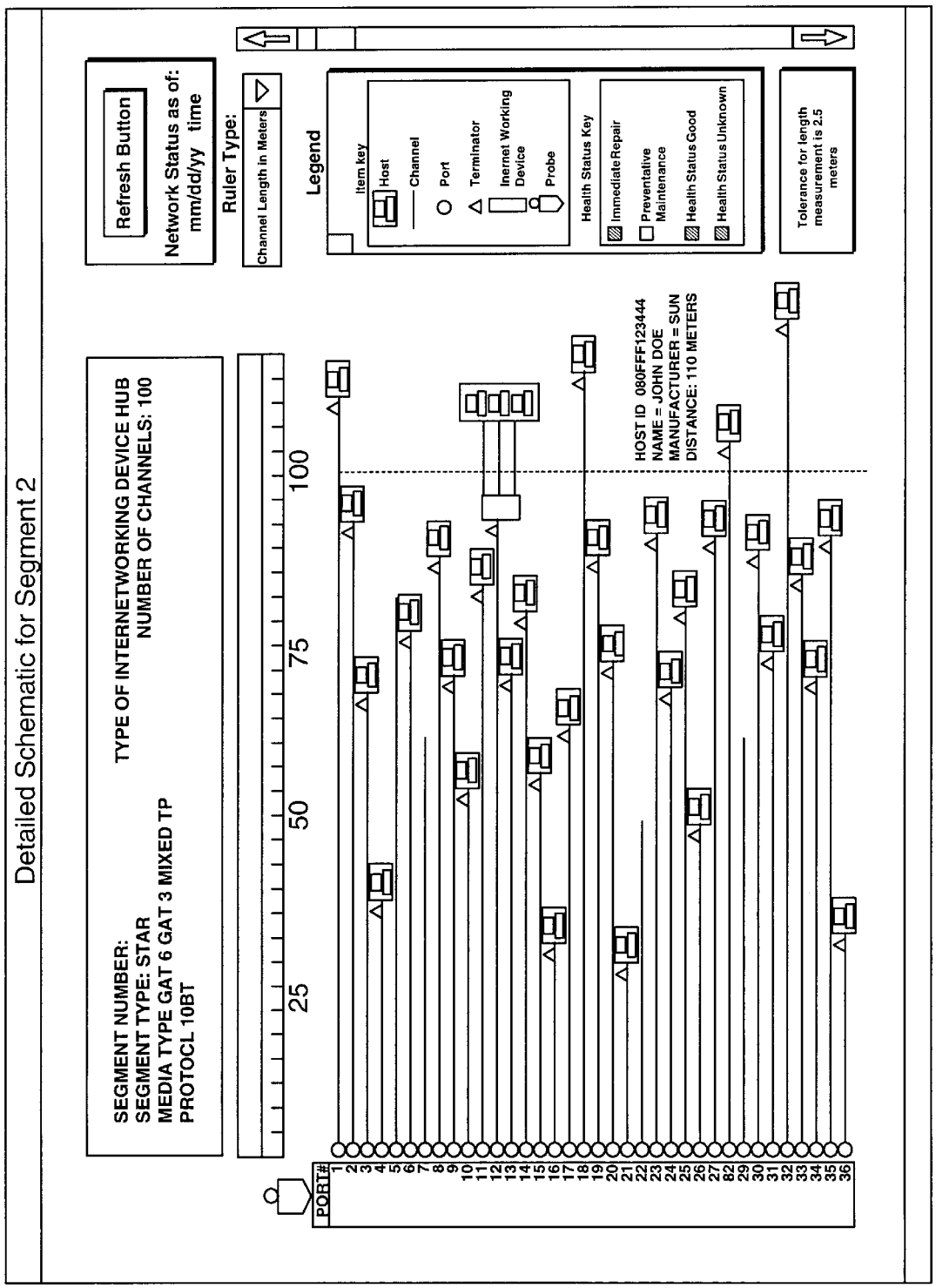
FIG. 14 is a graphical user interface displaying the information gained from the terminator detection according to the present invention.

FIG. 14 is a user interface that displays the information gained from the TDR cable length analysis on a monitor 142 of the system processor 140. For a 36 port hub, TDR analysis can be separately performed on each link. In the two-channel device shown in FIG. 1A, this probing must occur serially. The cable length derived from the analysis can then be displayed as shown also noting the maximum allowable cable length for the protocol and media type, here shown as 100 meters. Those links that do not conform with the protocol can be displayed as exceeding that distance. Additionally, the status of each of the links can be assessed and displayed. By reference to the impedance spectrum and the characteristics of the termination, open or short circuit, for example, problems can also be indicated by graphically identifying that terminals or links that require maintenance and the users on the links.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method for determining a length of a network cable in a computer network, comprising:

generating a predetermined signal on the network cable;

detecting a response of the cable to the predetermined signal at an intermediate location on the network cable between ends of the cable;

analyzing the response for an influence of a terminator, wherein determining the influence of the terminator comprises:

calculating at least a first-order differential of the response as a function of delay from the generation of the predetermined signal;

determining where the first-order differential indicates an inflection at a highest time delay from the predetermined signal; and identifying the inflection as the terminator;

determining a time delay between the generation of the predetermined signal and when the influence of terminator is detected; and calculating the length of the network cable to the terminator in response to the time delay.

2. The method described in claim 1, wherein detecting the influence of the terminator comprises determining a change in the influence of skin effects on the response resulting from the predetermined signal reaching the terminator.

3. The method described in claim 1, wherein generating the predetermined signal comprises generating a current step function on the network cable.

4. The method described in claim 1, wherein determining the influence of the terminator comprises detecting an inflection point in induced voltage on the network cable.

5. A method as described in claim 1, further comprising embedding the predetermined signal in a packet-line transmission.

6. A network termination analysis device for a digital data network, comprising:

a function generator that injects a predetermined signal onto cabling of a network;

a digitizer that digitally samples the network's response to the predetermined signal at an intermediate location on the cabling between ends of the cabling; and a system processor that downloads data from the digitizer, and that analyzes the network's response to the predetermined signal and identifies a time between the generation of the predetermined signal and a change in the network's response due to a terminator of the network, wherein the system processor detects an inflection point in induced voltage on the network cabling and detects the inflection point by calculating at least a first-order differential of the response as a function of delay from the generation of the predetermined signal.

7. A device as described in claim 6, wherein the function generator injects a step function.

8. A device as described in claim 6, wherein the function generator generates a packet-like transmission prior to the predetermined signal.

9. The device described in claim 6, wherein the system processor calculates lengths of the cabling base on the time between the generation of the predetermined signal and a change in the network's response due to the terminator.

10. The device described in claim 9, further comprising a monitor for displaying the calculated lengths for plural sets of cabling of the network.

11. The device described in claim 10, wherein the display further indicates a maximum protocol-determined length for the cabling.

12. The method described in claim 1, wherein generating a predetermined signal occurs at a non-terminator location on the network cable.

13. A device described in claim 6, wherein the function generator injects the predetermined signal at a non-terminator location onto the cabling of the network.

14. The method described in claim 1, wherein generating a predetermined signal occurs at an intermediate location on the network cable between ends of the cable.

15. A device described in claim 6, wherein the function generator injects the predetermined signal an intermediate location on the cabling between ends of the cabling.

* * * * *